United States Patent
Zhou et al.

(10) Patent No.: US 12,301,181 B2
(45) Date of Patent: May 13, 2025

(54) DIGITAL AUDIO POWER AMPLIFIER AND POWER AMPLIFIER LOOP

(71) Applicant: SHANGHAI AWINIC TECHNOLOGY CO., LTD, Shanghai (CN)

(72) Inventors: Jianing Zhou, Shanghai (CN); Haijun Zhang, Shanghai (CN); Wei Yao, Shanghai (CN); Liming Du, Shanghai (CN); Jiantao Cheng, Shanghai (CN); Hongjun Sun, Shanghai (CN)

(73) Assignee: SHANGHAI AWINIC TECHNOLOGY CO., LTD, Shanghai (CN)

( * ) Notice: Subject to any disclaimer, the term of this patent is extended or adjusted under 35 U.S.C. 154(b) by 507 days.

(21) Appl. No.: 17/756,601

(22) PCT Filed: Nov. 18, 2020

(86) PCT No.: PCT/CN2020/129674
§ 371 (c)(1),
(2) Date: May 27, 2022

(87) PCT Pub. No.: WO2021/104119
PCT Pub. Date: Jun. 3, 2021

(65) Prior Publication Data
US 2022/0416734 A1    Dec. 29, 2022

(30) Foreign Application Priority Data
Nov. 29, 2019    (CN) .......................... 201911217916.1

(51) Int. Cl.
*H03F 3/21*    (2006.01)
*H03F 1/26*    (2006.01)

(52) U.S. Cl.
CPC ............... *H03F 3/211* (2013.01); *H03F 1/26* (2013.01); *H03F 2200/03* (2013.01); *H03F 2200/129* (2013.01)

(58) Field of Classification Search
CPC ...... H03F 3/211; H03F 3/45475; H03F 3/183; H03F 3/68; H03F 3/2173; H03F 3/20;
(Continued)

(56) References Cited

U.S. PATENT DOCUMENTS 7,262,658 B2 * 8/2007 Ramaswamy ........ H03F 3/2173
330/10
9,306,523 B2 * 4/2016 Du ........................ H03F 3/2171
(Continued)

FOREIGN PATENT DOCUMENTS

CN    106255005 A    12/2016
CN    109068237 A    12/2018
(Continued)

OTHER PUBLICATIONS

The International Search Report mailed Mar. 1, 2021: PCT/CN2020/129674.
(Continued)

*Primary Examiner* — Andrea Lindgren Baltzell
*Assistant Examiner* — Nareh Shamiryan
(74) *Attorney, Agent, or Firm* — Emerson, Thomson & Bennett, LLC; Roger D. Emerson; Seth J. Niemi (57) ABSTRACT

Disclosed are a digital audio power amplifier and a power amplifier loop. The power amplifier loop comprises an operational amplifier U1, a capacitor C1, a power amplifier output stage, a resistor R1, a resistor R2 and a noise control unit, wherein an inverting input end of the operational amplifier U1 is respectively connected to one end of the capacitor C1, one end of the noise control unit and an output end of a preceding DAC current source; an output end of the
(Continued)

operational amplifier U1 is respectively connected to a control end of the power amplifier output stage and the other end of the capacitor C1; an output end of the power amplifier output stage is successively grounded by means of the resistors R1, R2; the other end of the noise control unit is connected to a connection point between the resistors R1, R2; the resistance values of the resistors R1, R2 are set to satisfy $R1/R2=(N-2)/2$, where $N>2$; the reference voltage of the operational amplifier U1 is equal to PVDD/N, with PVDD being a power supply voltage of the power amplifier output stage; and the noise control unit is a resistor module. The present application ensures the normal operation of the digital audio power amplifier.

12 Claims, 5 Drawing Sheets (58) Field of Classification Search
CPC ... H03F 3/181; H03F 1/26; H03F 1/56; H03F 2200/03; H03F 2200/129; H03F 2200/351; H03F 2203/45512; H03F 2203/45202
USPC .................................... 330/10, 207 A, 251
See application file for complete search history.

(56) References Cited

U.S. PATENT DOCUMENTS

| | | |
|---|---|---|
| 2013/0099857 A1 | 4/2013 | Friend et al. |
| 2017/0294888 A1 | 10/2017 | Berkhout et al. |

FOREIGN PATENT DOCUMENTS

| | | |
|---|---|---|
| CN | 208540150 U | 2/2019 |
| CN | 109660917 A | 4/2019 |
| CN | 208754539 U | 4/2019 |
| CN | 110212871 A | 9/2019 |
| CN | 110868162 A | 3/2020 |
| EP | 3229371 A1 | 10/2017 |
| WO | 2019/030518 A1 | 2/2019 |

OTHER PUBLICATIONS

Zhao Hailiang, et al; "Design of Input Chopper OP Used in Class D Amplifier", (C) 1994-2022 China Academic Journal Electronic Publishing House; http://www.cnki.net ; 5 pages.

The First Chinese Office Action dated Feb. 23, 2023; Appln. No. CN201911217916.1.

The second office action issued by CNIPA on Aug. 2, 2023, CN Application No. 201911217916.1.

* cited by examiner

Figure 1

PRIOR ART

DIGITAL AUDIO POWER AMPLIFIER AND POWER AMPLIFIER LOOP

The present application claims priority to Chinese Patent Application No. 201911217916.1, titled "DIGITAL AUDIO POWER AMPLIFIER AND POWER AMPLIFIER LOOP", filed on Nov. 29, 2019 with the China National Intellectual Property Administration, which is incorporated herein by reference in its entirety.

FIELD

The present disclosure relates to the technical field of power electronics, and in particular to a digital audio power amplifier and a power amplifier loop.

BACKGROUND

A signal inputted to a digital audio power amplifier is a digital audio signal. An audio signal is transmitted in a form of digital signal, having high anti-RF (radio frequency) interference performance and a low noise floor.

Figure 1:
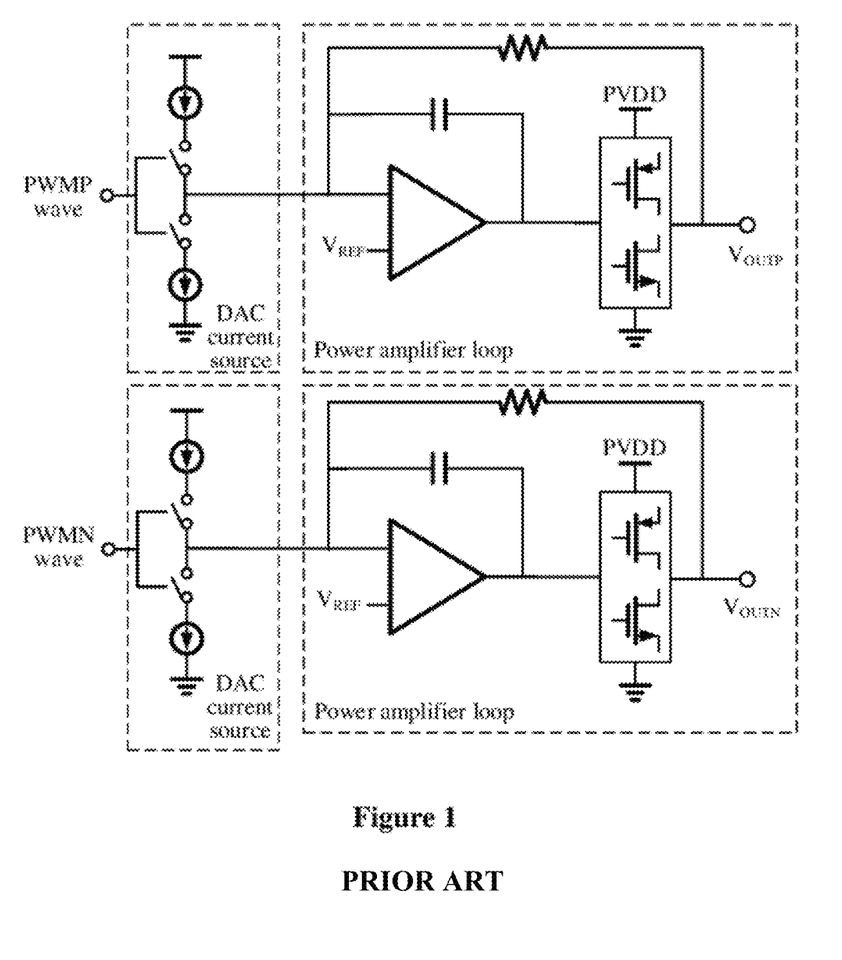
FIG. 1 is a schematic structural diagram illustrating a digital audio power amplifier according to the conventional technology.

FIG. 1 shows a conventional digital audio power amplifier. Components of the conventional digital audio power amplifier include a PWM (pulse width modulation) modulator (not shown in FIG. 1), two DAC current sources and two power amplifier loops. The PWM modulator modulates a digital audio signal to output a PWMP wave and a PWMN wave. One of the two DAC current sources and one of the two power amplifier loops process the PWMP wave, to output a voltage $V_{OUTP}$. The other of the two DAC current sources and the other of the two power amplifier loops process the PWMN wave, to output a voltage $V_{OUTN}$.

It is found from analysis that for any one of the power amplifier loops, in a case that a voltage outputted by the power amplifier reaches a power supply voltage PVDD, a reference voltage $V_{REF}$ of the power amplifier loop is equal to PVDD/2 in order to maintain balance between charging and discharging of a capacitor in the power amplifier loop. However, in some cases, a maximum operation voltage that the DAC current source and the power amplifier loop each support is equal to PVDD/2. In these cases, each of the DAC current source and the power amplifier loop does not have enough headroom voltage, resulting in failure by the digital audio power amplifier to operate normally.

SUMMARY

In view of this, a digital audio power amplifier and a power amplifier loop are provided according to the present disclosure, to ensure normal operation of the digital audio power amplifier.

A digital audio power amplifier includes a PWM modulator, two DAC current sources and two power amplifier loops. The PWM modulator is configured to modulate a digital audio signal, to output a PWMP wave and a PWMN wave. One of the two DAC current sources and one of the two power amplifier loops are configured to process the PWMP wave, to output a voltage signal. The other of the two DAC current sources and the other of the two power amplifier loops are configured to process the PWMN wave, to output another voltage signal. Each of the two power amplifier loops includes an operational amplifier U1, a capacitor C1, a power amplifier output stage, a first resistor R1, a second resistor R2 and a noise control unit. An inverting input terminal of the operational amplifier U1 is connected to a terminal of the capacitor C1, a terminal of the noise control unit, and an output terminal of the DAC current source at a preceding stage. An output terminal of the operational amplifier U1 is connected to a control terminal of the power amplifier output stage and another terminal of the capacitor C1. An output terminal of the power amplifier output stage is grounded via the first resistor R1 and the second resistor R2 sequentially. Another terminal of the noise control unit is connected to a joint at which the first resistor R1 is connected to the second resistor R2. A resistance of the first resistor R1 and a resistance the second resistor R2 are set based on R1/R2=(N−2)/2, where N is greater than 2. A reference voltage is inputted to a non-inverting input terminal of the operational amplifier U1, where the reference voltage is equal to PVDD/N, and PVDD represents a power supply voltage of the power amplifier output stage. The noise control unit is a resistor device.

In an embodiment, the noise control unit is an adjustable resistor device, and a resistance of the adjustable resistor device decreases as an amplitude of the digital audio signal decreases.

In an embodiment, the resistance of the adjustable resistor device changes stepwise as the amplitude of the digital audio signal changes.

In an embodiment, the noise control unit includes multiple resistors connected in series, each of the multiple resistors is connected to a switch in parallel, and an on-off state of the switch depends on the amplitude of the digital audio signal.

In an embodiment, the noise control unit includes three resistors $R_{F0}$, $R_{F1}$, and $R_{F2}$ connected in series, where $R_{F1}=R_{F0}$ and $R_{F2}=2*R_{F0}$.

In an embodiment, the noise control unit is configured to modify the resistance of the noise control unit at a zero-crossing of the digital audio signal.

In an embodiment, a gain of the PWM modulator increases as the resistance of the adjustable resistor device decreases, so as to maintain a constant total gain of the digital audio power amplifier.

In an embodiment, R2=2*R1.

A power amplifier loop includes an operational amplifier U1, a capacitor C1, a power amplifier output stage, a first resistor R1, a second resistor R2 and a noise control unit. An inverting input terminal of the operational amplifier U1 is connected to a terminal of the capacitor C1, a terminal of the noise control unit and an output terminal of a DAC current source at a preceding stage. An output terminal of the operational amplifier U1 is connected to a control terminal of the power amplifier output stage and another terminal of the capacitor C1. An output terminal of the power amplifier output stage is grounded via the resistor R1 and the resistor R2 sequentially. Another terminal of the noise control unit is connected to a joint where the resistor R1 is connected to the resistor R2. A resistance of the first resistor R1 and a resistance of the second resistor R2 are set based on R1/R2=(N−2)/2, where N is greater than 2. A reference voltage is inputted to a non-inverting input terminal of the operational amplifier U1, where the reference voltage is equal to PVDD/N, and PVDD represents a power supply voltage of the power amplifier output stage. The noise control unit is a resistor device.

In an embodiment, in the power amplifier loop according to the present disclosure, the noise control unit is an adjustable resistor device, and a resistance of the adjustable resistor device decreases as an amplitude of the digital audio signal decreases.

It can be seen from the above technical solutions that in the embodiments of the present disclosure, resistors R1 and R2 are added to the power amplifier loop for voltage division. Resistances of the resistors R1 and R2, and the reference voltage $V_{REF}$ of the power amplifier loop are set based on equations R1/R2=(N−2)/2 and $V_{REF}$=PVDD/N, where N is greater than 2. In this case, charging and discharging of the capacitor in the power amplifier loop are balanced, and the reference voltage $V_{REF}$ of the power amplifier loop is constantly less than PVDD/2, so that the current source and the power amplifier loop each constantly have a certain headroom voltage, ensuring normal operation of the digital audio power amplifier.

BRIEF DESCRIPTION OF THE DRAWINGS

In order to more clearly describe the technical solutions in the embodiments of the present disclosure or the technical solutions in the conventional technology, drawings to be used in the description of the embodiments or the conventional technology are briefly described hereinafter. It is apparent that the drawings described below merely illustrate some embodiments of the present disclosure, and those skilled in the art may obtain other drawings based on the provided drawings without any creative effort.

DETAILED DESCRIPTION OF EMBODIMENTS

Technical solutions in the embodiments of the present disclosure are clearly and completely described below in conjunction with the drawings in the embodiments of the present disclosure. Apparently, the embodiments described below are only some rather than all the embodiments of the present disclosure. Any other embodiments obtained by those skilled in the art based on the embodiments in the present disclosure without any creative effort fall within the protection scope of the present disclosure.

Figure 2:
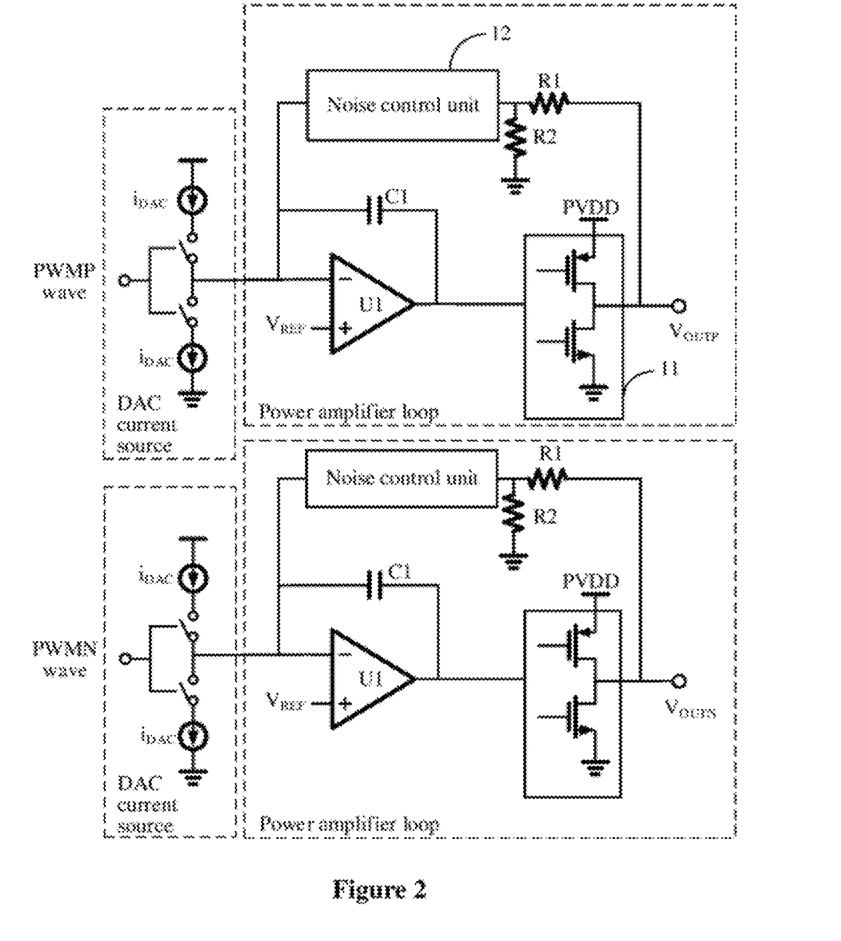
FIG. 2 is a schematic structural diagram illustrating a digital audio power amplifier according to an embodiment of the present disclosure.

Referring to FIG. 2, a digital audio power amplifier is provided according to an embodiment of the present disclosure. The digital audio power amplifier includes a PWM modulator (not shown in FIG. 2), two DAC current sources and two power amplifier loops.

The PWM modulator is configured to modulate a digital audio signal to output a PWMP wave and a PWMN wave. One of the two DAC current sources and one of the two power amplifier loops are configured to process the PWMP wave, to output a voltage $V_{OUTP}$. The other of the two DAC current sources and the other of the two power amplifier loops are configured to process the PWMN wave, to output a voltage $V_{OUTN}$.

Each of the two power amplifier loops includes an operational amplifier U1, a capacitor C1, a power amplifier output stage 11, a resistor R1, a resistor R2 and a noise control unit 12.

An inverting input terminal of the operational amplifier U1 is connected to a terminal of the capacitor C1, a terminal of the noise control unit 12 and an output terminal of the DAC current source at a preceding stage.

An output terminal of the operational amplifier U1 is connected to a control terminal of the power amplifier output stage 11 and another terminal of the capacitor C1.

An output terminal of the power amplifier output stage 11 is grounded via the resistor R1 and the resistor R2 sequentially.

Another terminal of the noise control unit 12 is connected to a joint where the resistor R1 is connected to the resistor R2.

Resistances of the resistor R1 and the resistor R2 are set based on an equation R1/R2=(N−2)/2, where N is greater than 2. A reference voltage $V_{REF}$ is applied to a non-inverting input terminal of the operational amplifier U1. The reference voltage $V_{REF}$ is equal to PVDD/N, where PVDD represents a power supply voltage of the power amplifier output stage 11.

In an embodiment, the noise control unit 12 is a resistor device.

In the embodiments of the present disclosure, the two DAC current sources have the same circuit structure, and the two power amplifier loops have the same circuit structure. The operation principle of the digital audio power amplifier according to the embodiments of the present disclosure is described in detail below by taking a path in which the PWMP wave is processed by the DAC current source and the power amplifier loop to output the $V_{OUTP}$ as an example.

Compared with the conventional power amplifier loop, in the power amplifier loop according to the embodiments of the present disclosure to, the resistors R1 and R2 are added for voltage division. Resistances of the resistors R1 and R2 and the reference voltage $V_{REF}$ of the power amplifier loop are set in such a way that a balance between charging and discharging of the capacitor in the power amplifier loop is maintained, and the reference voltage $V_{REF}$ of the power amplifier loop is less than PVDD/2 in a case that $V_{OUTP}$ reaches the power supply voltage PVDD. In the embodiments of the present disclosure, R1, R2 and $V_{REF}$ are set based on R1/R2=(N−2)/2 and $V_{REF}$=PVDD/N, where N is greater than 2. In order to facilitate practical application and simplify calculation, N is preferably an integer in the embodiments of the present disclosure. For example, N is equal to 3, and hence R2=2*R1. In this case, the reference voltage $V_{REF}$ is equal to PVDD/3, that is, $V_{REF}$ is approximately equal to 3.33V in a case that PVDD is equal to 10V. Therefore, in a case that a maximum operation voltage supported by the current source and power amplifier loop is equal to 5V, the circuit operates normally.

Next, it is verified that the digital audio power amplifier operates normally in a case of R2=2*R1 and $V_{REF}$=PVDD/3 by taking the path in which the PWMP wave is processed by the DAC current source and the power amplifier loop to output $V_{OUTP}$ as an example, and the verification is as follows.

Figure 3:
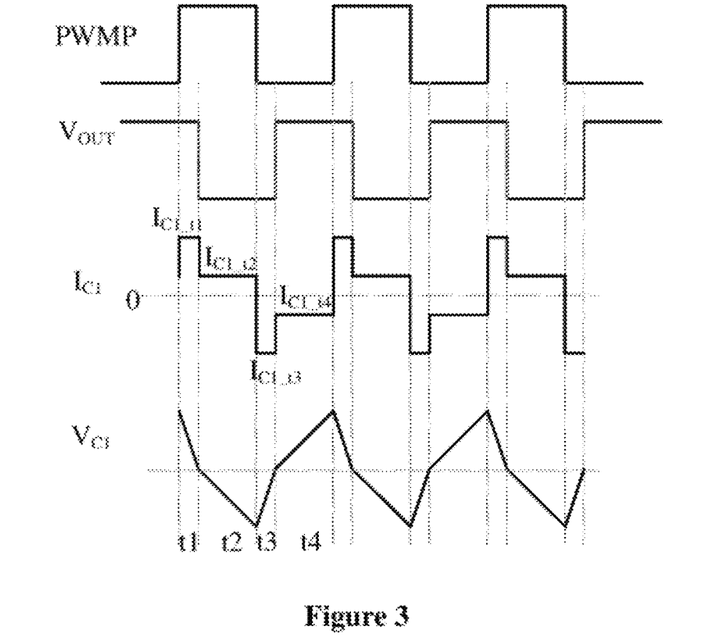
FIG. 3 is a diagram illustrating waveforms in charging and discharging of a capacitor C1 according to an embodiment of the present disclosure.

An equivalent resistor of the noise control unit 12 is defined as $R_F$. An output current of the DAC current source is $I_{DAC}$. $V_{OUT}$ is equal to $V_{OUTP}$ minus $V_{OUTN}$. A charging-discharging period T of the capacitor C1 is divided into four time intervals t1, t2, t3 and t4. Waveforms of the PWMP wave, $V_{OUT}$, a charging-discharging current $I_{C1}$ of the capacitor C1, and a potential $V_{C1}$ of a node on the right of the capacitor C1 are shown in FIG. 3.

During the time interval t1, the PWMP wave is at a high logic level represented by "1", and $V_{OUT}$ is at a high logic level represented by "1". The current $I_{DAC}$ charges the capacitor C1, and the output terminal of the power amplifier (that is, the output terminal of the power amplifier output stage) charges the capacitor C1 via the equivalent resistor $R_F$ (where in a case that $V_{OUT}$ is at the high logic level represented by "1", $V_{OUTP}$ is equal to PVDD, a potential of the joint where the resistors R1 is connected to R2 is equal to PVDD*2/3 due to voltage division by the resistors R1 and R2, and a potential of the inverting input terminal of the operational amplifier U1 is equal to a potential of the non-inverting input terminal of the operational amplifier U1, that is, $V_{REF}$=PVDD/3. Therefore, a voltage across the equivalent resistor $R_F$ is PVDD/3 minus PVDD*2/3, that is, −1/3*PVDD, and a current that the output terminal of the power amplifier charges the capacitor C1 via the equivalent resistor $R_F$ is ⅓*PVDD/$R_F$). In this case, the current flowing through the capacitor C1 is expressed as:

$$I_{C1\_t1}=I_{DAC}+⅓*PVDD/R_F \quad \text{Equation (2.1)}$$

During the time interval t2, the PWMP wave is at a high logic level represented by "1", and $V_{OUT}$ is at a low logic level represented by "0". The current $I_{DAC}$ charges the capacitor C1, and the output terminal of the power amplifier discharges the capacitor C1 via the equivalent resistor $R_F$ (where in a case that $V_{OUT}$ is at the low logic level represented by "0", $V_{OUTP}$ is equal to 0, the potential of the joint where the resistor R1 is connected to the resistor R2 is equal to 0, a potential of the inverting input terminal of the operational amplifier U1 is equal to a potential of the non-inverting input terminal of the operational amplifier U1, that is, $V_{REF}$=PVDD/3. Therefore, the voltage across the equivalent resistor $R_F$ is equal to PVDD/3, and a current that the output terminal of the power amplifier discharges the capacitor C1 via the equivalent resistor $R_F$ is ⅓*PVDD/$R_F$). In this case, the current flowing through the capacitor C1 is expressed as:

$$I_{C1\_t2}=I_{DAC}-⅓*PVDD/R_F \quad \text{Equation (2.2)}$$

During the time interval t3, the PWMP wave is at a low logic level represented by "0", and $V_{OUT}$ is at a low logic level represented by "0". The current $I_{DAC}$ discharges the capacitor C1, and the output terminal of the power amplifier discharges the capacitor C1 via the equivalent resistor $R_F$ (similar to the time interval t2, in a case that $V_{OUT}$ is at the low logic level represented logic "0", the current that the output terminal of the power amplifier discharges the capacitor C1 via the equivalent resistor $R_F$ is ⅓*PVDD/$R_F$). In this case, the current flowing through the capacitor C1 is expressed as:

$$I_{C1\_t3}=I_{DAc}-⅓*PVDD/R_F \quad \text{Equation (2.3)}$$

During the time interval t4, the PWMP wave is at a low logic level represented by "0", and $V_{OUT}$ is at a high logic level represented by "1". The current $I_{DAC}$ discharges the capacitor C1, and the output terminal of the power amplifier charges the capacitor C1 via the equivalent resistance $R_F$ (similar to the time interval t1, in a case that $V_{OUT}$ is at the high logic level represented by "1", the current that the output terminal of the power amplifier charges the capacitor C1 via the equivalent resistor $R_F$ is ⅓*PVDD/$R_F$). In this case, the current flowing through the capacitor C1 is expressed as:

$$I_{C1\_t4}=-I_{DAC}+⅓*PVDD/R_F \quad \text{Equation (2.4)}$$

In a case that the digital audio power amplifier operates normally, the balance between charging and discharging of the capacitor C1 is maintained during a charging-discharging period T, that is:

$$I_{C1\_t1}*t1+I_{C1\_t2}*t2=-I_{C1\_t3}*t3-I_{C1\_t4}*t4 \quad \text{Equation (2.5)}$$

The equations (2.1) to (2.4) are substituted into the equation (2.5), to obtain the following equation:

$$I_{DAC}(t_1+t_2)-I_{DAC}(t_3+t_4)=⅓*PVDD/R_F*(t_2+t_3)-⅓*PVDD/R_F*(t_1+t_4) \quad \text{Equation (2.6)}$$

An input duty ratio of the PWMP wave is expressed as $D_{IN}$, and hence t1+t2=$D_{IN}$*T, and t3+t4=(1−$D_{IN}$)*T. An output duty ratio of the PWMP wave (that is, a duty ratio of the output voltage $V_{OUTP}$) is expressed as $D_{OUT}$, and hence t1+t4=$D_{OUT}$*T, and t2+t3=(1−$D_{OUT}$)*T. Based on this, equation (2.6) is modified as:

$$D_{OUT} = \frac{1}{2} - \frac{3*R_F}{2*PVDD} * I_{DAC}(2*D_{IN} - 1) \quad \text{Equation (2.7)}$$

Due to $V_{OUTP}$=$D_{OUT}$*PVDD, equation (2.7) is modified as:

$$V_{OUTP} = \frac{1}{2} * PVDD - \frac{3*R_F}{2} * I_{DAC}(2*D_{IN} - 1) \quad \text{Equation (2.8)}$$

The equation (2.8) indicates that $V_{OUTP}$ is a signal with 1/2*PVDD as a common mode point and 50% input duty ratio as a center.

Similarly, $V_{OUTN}$ is expressed as $$V_{OUTN} = \frac{1}{2} * PVDD - \frac{3*R_F}{2} * I_{DAC}(1 - 2*D_{IN}).$$

The equation indicates that $V_{OUTN}$ is also a signal with 1/2*PVDD as a common mode point and 50% input duty ratio as a center.

In a case that R2 is equal to 2*R1 and $V_{REF}$ is equal to PVDD/3, it can be seen from the equations about $V_{OUTP}$ and $V_{OUTN}$ that the digital audio power amplifier operates normally, and charging and discharging of the capacitor C1 are balanced within a charging-discharging period T.

In the embodiments of the present disclosure, R1/R2=(N−2)/2 and $V_{REF}$=PVDD/N, where N is equal to 2. A large N results in a small reference voltage $V_{REF}$ and large headroom voltages of the DAC current source and the power amplifier loop. Since the headroom voltage is generally fixed, each of the resistors R1 and R2 is generally a fixed resistor.

In the embodiments of the present disclosure, the resistance of the equivalent resistor $R_F$ of the noise control unit 12 directly affects a gain of the power amplifier loop, which is analyzed as follows.

The equations about $V_{OUTP}$ and $V_{OUTN}$ are substituted into an equation $V_{OUT}=V_{OUTP}-V_{OUTN}$ to obtain the following equation:

$$V_{OUT}=3*R_F*I_{DAC}(1-2*D_{IN}) \quad \text{Equation (2.9)}$$

It can be seen from the equation (2.9) that the gain of the power amplifier loop is equal to 3*$R_F$*$I_{DAC}$, which is related to $R_F$. The gain of the power amplifier loop varies with the resistance of the equivalent resistor $R_F$ of the noise control unit 12.

Noise from the DAC current source in a high-voltage digital audio power amplifier has the greatest impact on output noise. The output noise can be effectively reduced by reducing the gain of the power amplifier loop. However, a too small gain of the power amplifier loop may result in very small power outputted by the power amplifier loop without distortion, which does not meet requirements of improving loudness of a speaker in practical applications. Therefore, it is required to ensure that a signal-to-noise ratio of the output signal (that is, a proportion of the output noise to the output signal of the digital audio power amplifier) remains in an ideal state. A small amplitude of the digital audio signal results in a large output power of the power amplifier loop and a large proportion of the output noise to the output signal of the digital audio power amplifier, and thus a further reduction in the output noise is required. Therefore, the gain of the power amplifier loop is properly set based on the amplitude of the digital audio signal, to achieve a good balance between the output power and the output noise, for a large output power and low noise in the output signal.

The noise control unit 12 may include a fixed resistor device, that is, a resistor device with a fixed resistance. However, the fixed resistor device may result in a limited application range of the digital audio power amplifier to an inputted digital audio signal. Therefore, in the embodiments of the present disclosure, the noise control unit 12 is preferably an adjustable resistor device, that is, a resistor device with an adjustable resistance. The resistance of the adjustable resistor device decreases as the amplitude of the digital audio signal decreases.

Figure 4:
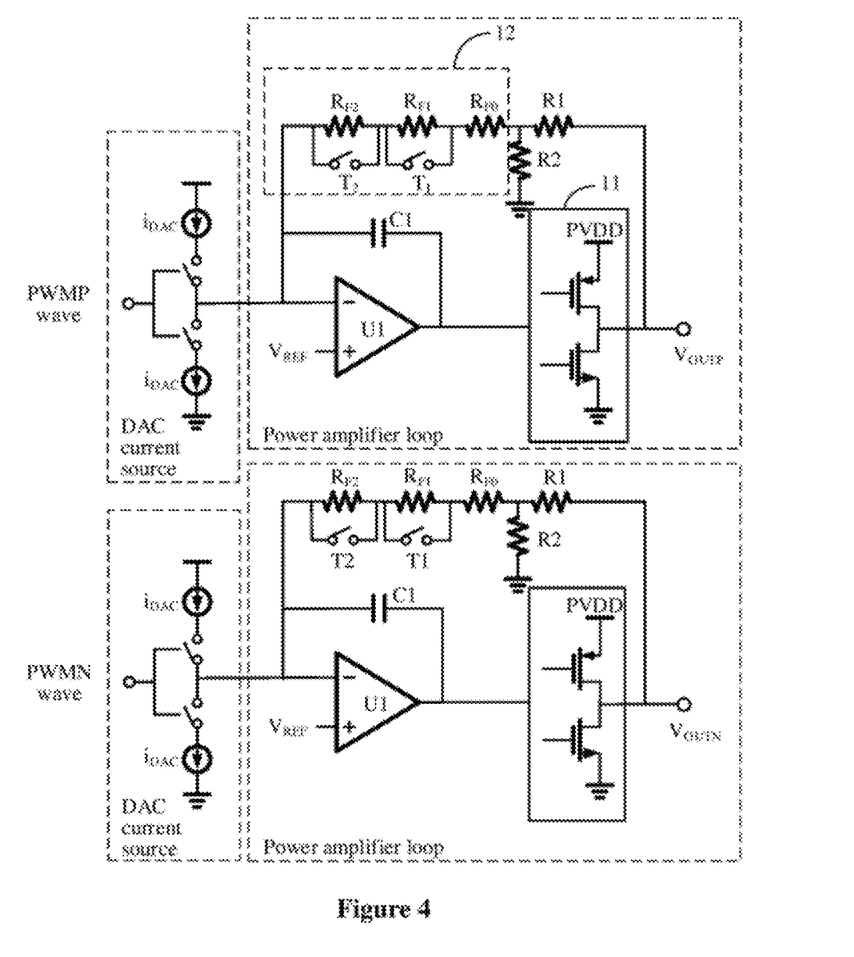
FIG. 4 is a schematic structural diagram illustrating a digital audio power amplifier according to another embodiment of the present disclosure.

Further, in the embodiments of the present disclosure, the resistance of the adjustable resistor device 12 preferably changes stepwise as the amplitude of the digital audio signal changes. In this case, a topology of the noise control unit 12 is shown in FIG. 4. The noise control unit 12 includes K resistors $R_{F0}$ to $R_{F(k-1)}$ that are connected in series, where K is greater than or equal to 1. Each of the resistors $R_{F1}$ to $R_{F(k-1)}$ is connected in parallel with a switch. For ease of description, a switch connected in parallel with a resistor $R_{FX}$ (where X=1, 2, . . . , k−1) is identified as $T_X$. FIG. 4 only illustrates an example in which k is equal to 3. The resistance of $R_F$ varies with an on-off state of each switch in the noise control unit 12. An on-off state of a switch in the noise control unit 12 depends on the amplitude of the digital audio signal.

In an example, k is equal to 3. In a case that switches $T_1$ and $T_2$ are off, the gain of the power amplifier loop is $3*(R_{F0}+R_{F1}+R_{F2})*I_{DAC}$. In a case that the switch $T_2$ is on and the switch $T_1$ is off, the gain of the power amplifier loop is $3*(R_{F0}+R_{F1})*I_{DAC}$. In a case that the switches $T_1$ and $T_2$ are on, the gain of the power amplifier loop is $3*R_{F0}*I_{DAC}$. In a case that $R_{F1}$ is equal to $R_{F0}$ and $R_{F2}$ is equal to $2*R_{F0}$, the following Table 1 is obtained.

| State | On-off state of each switch | Gain of the power amplifier loop |
| --- | --- | --- |
| 1 | $T_1$ and $T_2$ are off | $12*R_{F0}*I_{DAC}$ |
| 2 | $T_2$ is on and $T_1$ is off | $6*R_{F0}*I_{DAC}$ |
| 3 | $T_1$ and $T_2$ are on | $3*R_{F0}*I_{DAC}$ |

Referring to Table 1, in a case that the amplitude of the digital audio signal is greater than a set threshold 1, the power amplifier loop is controlled to operate in the above state 1. In a case that the amplitude of the digital audio signal is lower than the set threshold 1 and greater than a set threshold 2 (where the threshold 1 is greater than the threshold 2), a circuit state is switched at a zero-crossing of the digital audio signal (where a modification to the gain not at the zero-crossing of the signal may result in a sudden change of the output signal, which affects experience), to control the power amplifier loop to operate in the state 2. In a case that the amplitude of the digital audio signal is lower than the set threshold 2, the circuit state is switched at a zero-crossing of the digital audio signal, to control the power amplifier loop to operate in the state 3. It can be seen that in a case of adjustable resistor device, the noise control unit 12 delays the modification of its resistance until the digital audio signal inputted to the DAC current source crosses zero.

In addition, it should be noted that reducing the gain of the power amplifier can effectively reduce the output noise. However, in order to meet the requirements of improving the loudness of the speaker while avoiding a fluctuation in the loudness of the speaker in practical applications, a total gain of the digital audio power amplifier remains unchanged as much as possible. Therefore, in the embodiments of the present disclosure, a gain of the PWM modulator in the digital audio power amplifier is increased while reducing the gain of the power amplifier loop. For example, referring to Table 1, in a case that the power amplifier loop operates in the state 1, no modification is made to an original gain of the PWM modulator. In a case that the power amplifier loop operates in the state 2, the gain of the PWM modulator is twice the original gain of the PWM modulator. In a case that the power amplifier loop operates in the above state 3, the gain of the PWM modulator four times the original gain of the PWM modulator.

Figure 5:
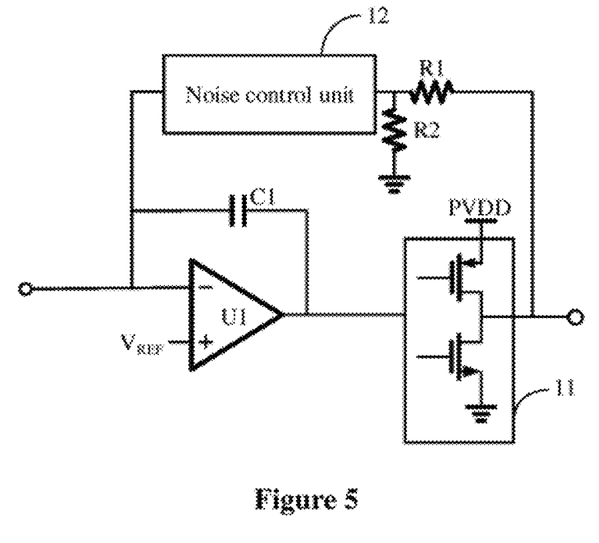
FIG. 5 is a schematic structural diagram illustrating a power amplifier loop according to an embodiment of the present disclosure.

As shown in FIG. 5, a power amplifier loop is further provided according to an embodiment of the present disclosure. The power amplifier loop includes an operational amplifier U1, a capacitor C1, a power amplifier output stage, a resistor R1, a resistor R2 and a noise control unit.

An inverting input terminal of the operational amplifier U1 is connected to a terminal of the capacitor C1, a terminal of the noise control unit and an output terminal of a DAC current source at a preceding stage.

An output terminal of the operational amplifier U1 is connected to a control terminal of the power amplifier output stage and another terminal of the capacitor C1.

An output terminal of the power amplifier output stage is grounded via the resistor R1 and the resistor R2 sequentially.

Another terminal of the noise control unit is connected to a joint where the resistor R1 is connected to the resistor R2.

Resistances of the resistor R1 and the resistor R2 are set based on an equation R1/R2=(N−2)/2, where N is greater than 2. A reference voltage is applied to a non-inverting input terminal of the operational amplifier U1. The reference voltage is equal to PVDD/N, where PVDD represents a power supply voltage of the power amplifier output stage.

The noise control unit is a resistor device.

In an embodiment, the noise control unit is an adjustable resistor device, and a resistance of the adjustable resistor device decreases as the amplitude of the digital audio signal decreases.

In an embodiment, the resistance of the adjustable resistor device changes stepwise as the amplitude of the digital audio signal changes.

In an embodiment, the noise control unit includes multiple resistors that are connected in series. Each of the resistors is connected to a switch in parallel. An on-off state of each switch depends on the amplitude of the digital audio signal.

In an embodiment, the noise control unit delays a modification of its resistance until the digital audio signal inputted to the DAC current source crosses zero.

Embodiments of the digital audio power amplifier in this specification are described in a progressive way. Each of the embodiments of the digital audio power amplifier emphasizes the differences from other embodiments of the digital audio power amplifier. For the same or similar parts among the embodiments of the digital audio power amplifier, reference is made to each other. Since the embodiments of the power amplifier loop correspond to the technical solutions disclosed in the embodiments of the digital audio power amplifier, the description of the embodiments of the power amplifier loop is relatively simple. For relevant details, reference is made to the description of the embodiments of the digital audio power amplifier.

Relationship terms such as "first", "second" and the like herein are merely for distinguishing an entity or operation from another and are not necessarily for indicating or implying an actual relationship or order between these entities or operations. In addition, terms of "include", "comprise" or any other variants thereof are intended to be non-exclusive. Therefore, a process, method, article or device including a series of elements includes not only the listed elements but also other elements that are not enumerated, or also include elements inherent in the process, method, article or device. Unless expressively limited otherwise, an element defined by the statement "comprising a . . . " does not exclude a case that additional similar elements are included in the process, method, article or device including the element.

It should further be understood by those skilled in the art that the units and algorithm steps in examples described in conjunction with the embodiments of the present disclosure may be implemented as electronic hardware, computer software, or a combination thereof. In order to clearly illustrate the interchangeability of hardware and software, the units and steps in these examples are generally described above based on functions. Whether these functions are implemented by hardware or software depends on specific applications of the technical solutions and design constraints. For each of the specific applications, those skilled in the art may implement the functions described above in various manners, and these implementations should fall within the scope of the present disclosure.

With the description of the embodiments disclosed above, those skilled in the art may implement or use the technical solutions of the present disclosure. Those skilled in the art may easily think of numerous modifications to these embodiments, and the general principles defined herein may be implemented in other embodiments without departing from the spirit or scope of the present disclosure. Therefore, embodiments of the present disclosure should comply with the widest scope consistent with the principles and novel features disclosed herein rather than be limited to the embodiments described herein.

The invention claimed is:

1. A digital audio power amplifier, comprising: a PWM modulator, two DAC current sources and two power amplifier loops, wherein
the PWM modulator is configured to modulate a digital audio signal, to output a PWMP wave and a PWMN wave;
one of the two DAC current sources and one of the two power amplifier loops are configured to process the PWMP wave, to output a voltage signal;
the other of the two DAC current sources and the other of the two power amplifier loops are configured to process the PWMN wave, to output another voltage signal; and
each of the two power amplifier loops comprises an operational amplifier U1, a capacitor C1, a power amplifier output stage, a first resistor R1, a second resistor R2 and a noise control unit, wherein an inverting input terminal of the operational amplifier U1 is connected to a terminal of the capacitor C1, a terminal of the noise control unit, and an output terminal of the DAC current source at a preceding stage;
an output terminal of the operational amplifier U1 is connected to a control terminal of the power amplifier output stage and another terminal of the capacitor C1;
an output terminal of the power amplifier output stage is grounded via the first resistor R1 and the second resistor R2 sequentially;
another terminal of the noise control unit is connected to a joint at which the first resistor R1 is connected to the second resistor R2;
a resistance of the first resistor R1 and a resistance the second resistor R2 are set based on R1/R2=(N−2)/2, wherein N is greater than 2;
a reference voltage is inputted to a non-inverting input terminal of the operational amplifier U1, wherein the reference voltage is equal to PVDD/N, and PVDD represents a power supply voltage of the power amplifier output stage; and
the noise control unit is a resistor device;
the noise control unit is an adjustable resistor device, and a resistance of the adjustable resistor device decreases as an amplitude of the digital audio signal decreases.

2. The digital audio power amplifier according to claim 1, wherein the resistance of the adjustable resistor device changes stepwise as the amplitude of the digital audio signal changes.

3. The digital audio power amplifier according to claim 1, wherein the noise control unit comprises a plurality of resistors connected in series, each of the plurality of resistors is connected to a switch in parallel, and an on-off state of the switch depends on the amplitude of the digital audio signal.

4. The digital audio power amplifier according to claim 3, wherein the noise control unit comprises three resistors $R_{F0}$, $R_{F1}$, and $R_{F2}$ connected in series, and wherein $R_{F1}=R_{F0}$ and $R_{F2}=2*R_{F0}$.

5. The digital audio power amplifier according to claim 1, wherein the noise control unit is configured to modify the resistance of the noise control unit at a zero-crossing of the digital audio signal.

6. The digital audio power amplifier according to claim 1, wherein a gain of the PWM modulator increases as the resistance of the adjustable resistor device decreases, so as to maintain a constant total gain of the digital audio power amplifier.

7. The digital audio power amplifier according to claim 1, wherein R2=2*R1.

8. A power amplifier loop, comprising: an operational amplifier U1, a capacitor C1, a power amplifier output stage, a first resistor R1, a second resistor R2 and a noise control unit, wherein:
an inverting input terminal of the operational amplifier U1 is connected to a terminal of the capacitor C1, a terminal of the noise control unit and an output terminal of a DAC current source at a preceding stage;
an output terminal of the operational amplifier U1 is connected to a control terminal of the power amplifier output stage and another terminal of the capacitor C1;
an output terminal of the power amplifier output stage is grounded via the resistor R1 and the resistor R2 sequentially;
another terminal of the noise control unit is connected to a joint at which the resistor R1 is connected to the resistor R2;

a resistance of the first resistor R1 and a resistance of the second resistor R2 are set based on an R1/R2=(N−2)/2, wherein N is greater than 2;

a reference voltage is inputted to a non-inverting input terminal of the operational amplifier U1, wherein the reference voltage is equal to PVDD/N, and PVDD represents a power supply voltage of the power amplifier output stage; and the noise control unit comprises a resistor device;

wherein the noise control unit comprises an adjustable resistor device, and a resistance of the adjustable resistor device decreases as an amplitude of a digital audio signal decreases, the digital audio signal being a signal input to an digital audio power amplifier in which the power amplifier loop is located.

9. The power amplifier loop according to claim 8, wherein the resistance of the adjustable resistor device changes stepwise as the amplitude of the digital audio signal changes.

10. The power amplifier loop according to claim 8, wherein the noise control unit comprises a plurality of resistors connected in series, each of the plurality of resistors is connected to a switch in parallel, and an on-off state of the switch depends on the amplitude of the digital audio signal.

11. The power amplifier loop according to claim 10, wherein the noise control unit comprises three resistors $R_{F0}$, $R_{F1}$, and $R_{F2}$ connected in series, and wherein $R_{F1}=R_{F0}$ and $R_{F2}=2*R_{F0}$.

12. The power amplifier loop according to claim 8, wherein the noise control unit is configured to modify the resistance of the noise control unit at a zero-crossing of the digital audio signal.

* * * * *